Nov. 1, 1966 E. E. JOHNSON, JR., ET AL 3,283,058

RADIO FREQUENCY SHIELDING ENCLOSURE

Filed Sept. 27, 1965

Ernest E. Johnson, Jr.
Emmons R. Radford,
INVENTORS.
Harry M. Saragovitz
BY Edward J. Kelly
Herbert Berl
J. Keith Fowler United States Patent Office 3,283,058
Patented Nov. 1, 1966

3,283,058
RADIO FREQUENCY SHIELDING ENCLOSURE

Ernest E. Johnson, Jr., Liverpool, and Emmons R. Radford, Warners, N.Y., assignors, by mesne assignments, to the United States of America as represented by the Secretary of the Army Filed Sept. 27, 1965, Ser. No. 490,754
5 Claims. (Cl. 174—35)

This invention relates to improvements in electronic equipment enclosures and more particularly to a radio frequency shielding enclosure for shielding electronic equipment, housed within the enclosure against the passage of undesirable radio frequency energy. The present invention contemplates the provision of an improved electronic equipment enclosure having a novel shield for shielding the access opening thereof.

It is common practice in the electronic equipment art, particularly, in the missile field, to provide a radio frequency shield for shielding an equipment enclosure against the passage of undesirable radio frequency energy. Heretofore known shielding apparatus has been relatively complex in structure and in the manner of operation. These disadvantages, along with the requirement in known enclosures for critical dimensions and tolerances, have necessarily resulted in relatively high costs.

Accordingly, a principal object of the present invention is to provide a simple, reliable and effective shielding enclosure for electronic equipment and the like devices.

Another object of this invention is to provide a radio frequency shielding enclosure having good electrical contact around its cover or door.

A further object of this invention is to provide a radio frequency shielding enclosure which has relative freedom of arrangement without requiring critical dimensions and tolerances.

A still further object of this invention is to provide a shielding enclosure having ease of mechanical operation, application and maintenance.

Another object of the invention resides in the provision of an enclosure having a radio frequency shield mounted therein in a manner wherein the active contact element of the shield is protected from accidental damage.

Figure 1:
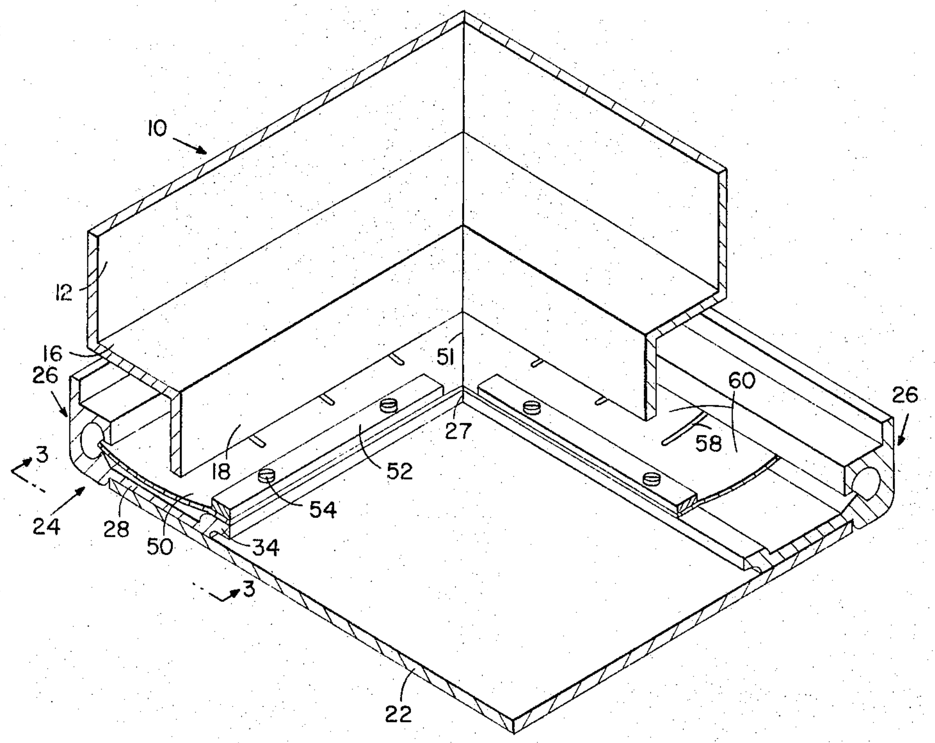
Figure 2:
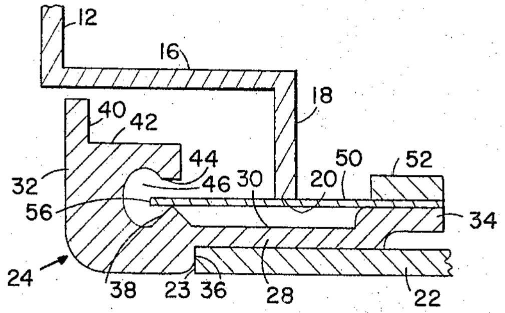
Figure 3:
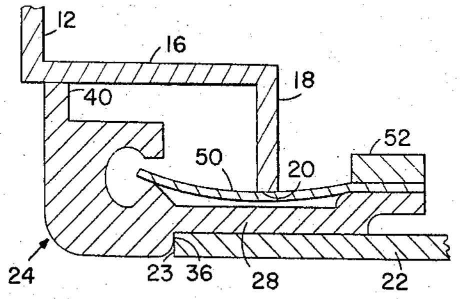

These and other objects and advantages of the invention will become more fully apparent upon consideration of the following detailed description and accompanying drawing, wherein:

FIGURE 1 is a perspective, sectional view (with portions cut away) of an electronic equipment enclosure showing the shielding enclosure arrangement in operative position;

FIGURE 2 is an enlarged sectional view taken in the direction indicated by line 3—3 in FIGURE 1, but illustrating the relationship of the enclosure wall edge, the door, and the shielding arrangement for the enclosure prior to closure of the door; and FIGURE 3 is an enlarged sectional view taken on line 3—3 of FIGURE 1, illustrating the relationship of the enclosure wall edge, the door, and the shielding arrangement of the enclosure in the closed position.

Referring in detail to the drawing, there is shown (FIGURE 1) a cutaway portion of an equipment cabinet or enclosure 10 defined by a plurality of side walls 12 (only a portion of two such walls being shown). Walls 12 terminate in an indented or channeled peripheral, end-wall portion formed by flanges 16 and 18. Thus, the access opening of the enclosure, as defined by wall flanges 18, is of a slightly smaller area than the inside area within walls 12. A door 22 (partially shown) is normally hinged (not shown) at the access opening of the enclosure for closing engagement therewith.

To provide shielding means between door 22 and the peripheral edge or rim 20 of the enclosure walls, a radio frequency shielding device 24 is secured in operative position therebetween. Shield device 24 is formed of a plurality of elongated, generally U-shaped, channel sections 26 (only two of which are partially shown in FIG. 1) secured together at adjacent ends as at 27 for extending around the peripheral edge 23 of the rectangular door. Each channel section includes an elongated base 28 having an interior surface 30 and a pair of side flanges or legs 32, 34 extending normally therefrom, said legs being disposed in spaced, parallel relationship. The base is recessed at 36 throughout the length of its exterior surface for accommodating the peripheral edge portion of door 22. A support ridge 38 formed integral with surface 30 extends longitudinally throughout the length of base 28. Leg 32 is formed with an extension flange 40 and a lip flange 42. The latter flange is turned inwardly toward the base as seen at 44 so as to be in direct alignment with but spaced from the apex of ridge 38. Leg 32 is further formed with a hollowed guard chamber 46 extending throughout the longitudinal length thereof adjacent ridge 38. A thin, flat, generally rectangular, electrically conductive, spring strip 50 is positioned over each channel section 26 in spaced, parallel relation with its base. Strip 50 is secured along one longitudinally extending edge to the upper portion of leg 34 as by a retaining element 52 and a plurality of screws 54. The cross-section (FIG. 2) of the shield device is that of a cantilevered beam simply supported or resting near its opposite, free edge 56 on the apex of ridge 38. The strip provides electrical sealing means when door 22 with shield device 24 secured about its entire periphery is moved to closed position (FIG. 3) with peripheral edge 20 of the cabinet. Each of the strips is provided with a plurality of narrow slots 58 extending laterally inward from free edge 56 thereof, thus, defining a plurality of resilient fingers 60. The free edge of the spring strip extends beyond flange 44 within guard chamber 46 and is, thus, protected at all times from accidental damage by said guard means. Adjoining strips 50 are secured together at adjacent ends as depicted at 51 (FIG. 1).

To position shield device 24 for use on door 22, each section 26 is welded or otherwise secured to the side of the door facing the access opening of the cabinet and about the entire perimeter thereof. It is noted that the peripheral edge portions of the door are received flush within recessed portions 36 in bases 28 of channel sections 26.

In operation, as door 22 having a shielding device 24 secured thereto is moved toward closed position, rim 20 of equipment cabinet 10 engages an intermediate portion of each of the spring strips 50 and acts as a knife edge deflecting the spring strips inwardly of channels 26 in a direction normal to bases 28 (FIG. 3). It will be apparent that said inward movement will be limited by engagement of extension flanges 40 with ledge portions 16 of walls 12. In addition to functioning as a limit stop for the door, the abutting engagement of flanges 40 and ledge portions 16 functions as a further shielding or sealing means for the cabinet. Thus, the cabinet provides an electrical seal by deflecting the spring strip thereby making electrical contact between the cabinet rim and both sides of the channels. The combination of a cantilever and a simple support for the spring strips imparts a "contact wiping" action between the mid-portion of the strips and the cabinet access opening or rim 20, as well as between the strips and their simple support on ridges 38. Such "contact wiping" action is most desirable since optimum electrical contact is obtained between the door and the enclosure. Accordingly, a most effective and reliable shielding enclosure is provided by the present invention. In addition, the enclosure includes a shielding device wherein the active contact element or strip is protected at all times against accidental damage by guard means 46.

The preferred embodiment illustrated herein employs an aluminum door and extrusion, a beryllium copper strip and a steel cabinet. However, the scope of this application should not be restricted to the use of these materials. It will be apparent that any material capable of radio frequency shielding may be used in making the enclosure. For instance, in installations wherein the induced currents are of a magnitude and frequency sufficient to require magnetic as well as electrical shielding, suitable magnetic materials can be substituted for the nonferrous materials disclosed.

From the foregoing, it will be seen that an improved radio frequency shielding enclosure is provided, which enclosure is of simple and compact construction, which is easily assembled for operation, and which is highly effective, reliable, and easily maintained. Further, shielding structure is provided which is easily modified for enclosure openings of varying size. In addition, while the description is drawn specifically to an electronic equipment enclosure, it should be apparent that the same structural arrangement is equally applicable to instrument casings or missile compartments which contain mechanisms that are sensitive to radio frequency energy.

It is to be understood that the specific embodiment of the invention described is merely illustrative of the principles of the invention and that various changes and modifications may be made without departing from the spirit and scope of the invention as set forth in the appended claims.

What is claimed is:

1. A radio frequency shielding enclosure adapted for shielding electronic equipment housed therein, said enclosure including:

a main body portion made of a material capable of radio frequency shielding formed by a plurality of side walls, said body portion being open at one end, said side walls terminating in an annular indented portion adjacent said open end, said indented portion being formed by a first flange extending inwardly toward the central axis of said main body and a terminal wall portion extending normally from the inner edge of said first flange whereby the exposed rim portion of said terminal wall portion defines an access opening of smaller area than the area defined by the side walls of the main body portion;

a closure member made of a material capable of radio frequency shielding disposed so as to close said access opening;

a radio frequency shield device secured about the perimeter of said closure member on the side thereof facing said access opening, said device comprising a plurality of elongated, U-shaped channel sections joined together in end-to-end relationship, each said section including an elongated generally rectangular base and a pair of legs extending in normal relationship from the longitudinal edges thereof, one of said legs having the terminal end thereof adapted for abutting engagement with said first flange, a protruding ridge extending from the interior of said base throughout the length thereof, said ridge being disposed adjacent said one leg, and a plurality of thin, rectangular strips joined together in end-to-end relationship, each said strip being formed of electrically conductive spring material disposed in spaced, parallel relation with the interior surface of each said base, each said strip having a first longitudinal edge secured to the other of said legs and a second longitudinal, free edge extending in overlapping relation with said ridge, each said strip resting for support on said ridge along a portion thereof intermediate said first and second edges and adjacent said free edge;

whereby, upon movement of said closure member to a closed position wherein said strips are engaged by said exposed rim portion along a portion thereof intermediate said first edge and said ridge, said strips will be flexed in a direction toward said channel base, the degree of flexing being limited by engagement of said one leg and said first flange.

2. A radio frequency shielding enclosure as recited in claim 1, wherein guard means is formed in the interior surface of said one leg protecting the free edge of said strip, said guard means including an elongated chamber having an opening receiving said free edge therewithin.

3. A radio frequency shielding enclosure as recited in claim 1 wherein said strip is formed of beryllium copper, said enclosure is formed of steel, and said closure member is formed of aluminum.

4. In a radio frequency shielding enclosure including a plurality of side walls formed of a material capable of radio frequency shielding, said side walls terminating in a transversely extending end wall, said end wall having an access opening defined by an exposed peripheral edge which extends outwardly a predetermined distance beyond said end wall, said enclosure having a door adapted to close said access opening when moved into closed position therewith and formed of a material capable of radio frequency shielding, the improvement comprising:

a radio frequency shielding device secured about the periphery of said door and extending completely therearound, said device being U-shaped in cross-section thereby defining a base and a pair of legs extending from said base, said device being secured to the door on the side thereof that closes with the access opening and disposed so as to receive said exposed edge between said legs;

a ridge formed on the interior of said base and spaced inwardly of, but in close proximity to, one of said legs, said ridge extending in the same direction as said legs;

a thin strip of electrically conductive spring material normally disposed in spaced, parallel relation with the interior surface of said base, said strip being secured solely by one edge thereof wherein said one edge is secured to the other of said legs and the opposite edge freely extends beyond said ridge, said strip engaging the apex of said ridge inwardly of said opposite, free edge;

whereby, upon closing said door, said exposed peripheral edge of the enclosure engages said strip intermediate said other leg and said ridge thereby flexing the strip in a direction toward said door, and whereby the terminal end of said one leg engages said enclosure end wall.

5. A radio frequency shielding enclosure as recited in claim 4, wherein said strip is provided with a plurality of transverse slots extending inwardly from the free longitudinal edge thereof.

References Cited by the Examiner

UNITED STATES PATENTS

| | | | |
|---|---|---|---|
| 2,757,225 | 7/1956 | Dunn | 174—35 |
| 2,958,754 | 11/1960 | Hahn. | |
| 3,055,969 | 9/1962 | Schaller | 174—35 |

LEWIS H. MYERS, *Primary Examiner.*

DOWELL L. CLAY, *Examiner.*